United States Patent
Albertinetti et al.

(10) Patent No.: US 12,525,512 B2
(45) Date of Patent: Jan. 13, 2026

(54) METHOD OF COUPLING SEMICONDUCTOR DICE AND CORRESPONDING SEMICONDUCTOR DEVICE

(71) Applicant: STMicroelectronics S.r.l., Agrate Brianza (IT)

(72) Inventors: Andrea Albertinetti, Sizzano (IT); Mirko Alesi, Gorgonzola (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 660 days.

(21) Appl. No.: 17/872,774

(22) Filed: Jul. 25, 2022

(65) Prior Publication Data

US 2023/0035470 A1   Feb. 2, 2023

(30) Foreign Application Priority Data

Jul. 30, 2021   (IT) .......................... 102021000020540

(51) Int. Cl.
*H01L 23/495*   (2006.01)
*H01L 21/48*   (2006.01)
(Continued)

(52) U.S. Cl.
CPC .... *H01L 23/49527* (2013.01); *H01L 21/4825* (2013.01); *H01L 21/565* (2013.01);
(Continued)

(58) Field of Classification Search
CPC ............... H01L 21/4825; H01L 21/565; H01L 23/3107; H01L 23/49513; H01L 23/49575
(Continued)

(56) References Cited

U.S. PATENT DOCUMENTS 9,281,235 B2 * 3/2016 Kim ................... H01L 25/0657
2009/0072379 A1 3/2009 Ewe et al.
(Continued)

FOREIGN PATENT DOCUMENTS

| CN | 112992687 A | 6/2021 |
| CN | 112992689 A | 6/2021 |
| CN | 218333795 U | 1/2023 |

OTHER PUBLICATIONS

IT Search Report and Written Opinion for priority application, IT 102021000020540, report dated Apr. 5, 2022, 11 ogs.
(Continued)

*Primary Examiner* — Eva Y Montalvo
(74) *Attorney, Agent, or Firm* — Crowe & Dunlevy LLC

(57) ABSTRACT

An encapsulation of laser direct structuring (LDS) material is molded onto a substrate having first and second semiconductor dice arranged thereon. Laser beam energy is applied to a surface of the encapsulation of LDS material to structure therein die vias extending through the LDS material to the first and second semiconductor dice and a die-to-die line extending at surface of the LDS material between die vias. Laser-induced forward transfer (LIFT) processing is applied to transfer electrically conductive material to the die vias and the die-to-die line extending between die vias. A layer of electrically conductive material electroless grown onto the die vias and the die-to-die line facilitates improved adhesion of the electrically conductive material transferred via LIFT processing.

11 Claims, 3 Drawing Sheets

(51) Int. Cl.
   *H01L 21/56* (2006.01)
   *H01L 23/31* (2006.01)
(52) U.S. Cl.
   CPC .... *H01L 23/3107* (2013.01); *H01L 23/49513* (2013.01); *H01L 23/49575* (2013.01)
(58) Field of Classification Search
   USPC ........................................................ 267/666
   See application file for complete search history.

(56) References Cited

U.S. PATENT DOCUMENTS

| | | | |
|---|---|---|---|
| 2010/0019370 A1 | 1/2010 | Pressel et al. | |
| 2011/0003440 A1 | 1/2011 | Mengel et al. | |
| 2017/0084541 A1* | 3/2017 | Hsu | H01L 21/4853 |
| 2018/0061767 A1* | 3/2018 | Chiang | H01L 25/50 |
| 2018/0224481 A1 | 8/2018 | Kim et al. | |
| 2018/0342453 A1 | 11/2018 | Ziglioli | |
| 2019/0115287 A1 | 4/2019 | Derai et al. | |
| 2020/0203264 A1 | 6/2020 | Ziglioli | |
| 2020/0321269 A1 | 10/2020 | Chiang et al. | |
| 2020/0321274 A1 | 10/2020 | Magni | |
| 2021/0050226 A1 | 2/2021 | Derai et al. | |
| 2021/0050299 A1 | 2/2021 | Ziglioli et al. | |
| 2021/0183748 A1 | 6/2021 | Derai et al. | |

OTHER PUBLICATIONS

CN First Office Action and Search Report for counterpart CN Appl. No. 202210909718.7, report dated Jun. 25, 2025, 5 pgs.

\* cited by examiner

METHOD OF COUPLING SEMICONDUCTOR DICE AND CORRESPONDING SEMICONDUCTOR DEVICE

PRIORITY CLAIM

This application claims the priority benefit of Italian Application for Patent No. 102021000020540, filed on Jul. 30, 2021, the content of which is hereby incorporated by reference in its entirety to the maximum extent allowable by law.

TECHNICAL FIELD

The description relates to semiconductor devices.

One or more embodiments can be applied to semiconductor devices comprising die-to-die connections.

System-in-Package (SiP) devices including plural circuits integrated in one or more chip carrier packages may be exemplary of such devices.

BACKGROUND

Various types of semiconductor devices such as power devices, for instance, may involve die-to-die coupling.

A device where a power semiconductor chip or die (gallium nitride or GaN, for instance) is desired to be connected to a driver chip or die manufactured using BCD (Bipolar-CMOS-DMOS) technology may be exemplary of such an instance.

Laser direct structuring (LDS) technology has been recently proposed to replace conventional wire bonding in providing die-to-lead electrical connections in a semiconductor device.

In laser direct structuring technology as currently performed today, after laser beam structuring (activation) of the LDS material, electrical conductivity of formations such as vias and tracks is facilitated via electro-less metallization and galvanic plating to reach a metallization thickness of tens of microns of metal material such as copper.

An issue arising in trying to apply LDS technology to die-to-die coupling lies in that the associated conductive patterns are electrically floating nodes.

The expected use of electroplating to facilitate adequate conductivity of the electrically conductive formations (vias and/or lines or tracks) structured via LDS technology thus militates against extending the use of LDS technology from die-to-lead coupling to die-to-die coupling.

There is a need in the art to contribute in adequately dealing with such an issue.

SUMMARY

One or more embodiments relate to a method.

One or more embodiments relate to a corresponding semiconductor device. A semiconductor device such as a power device comprising plural, mutually coupled semiconductor chips or dice may be exemplary of such a device.

One or more embodiments combine laser direct structuring technology (including plating) with laser induced forward transfer (LIFT) technology.

LIFT technology can be used to complete the growth (filling) of vias/tracks in die-to-die interconnections.

One or more embodiments may benefit from the fact that an electro-less underlayer as currently used in LDS technology facilitates adhesion of the LIFT material to the (LDS) molding compound.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figure 1:
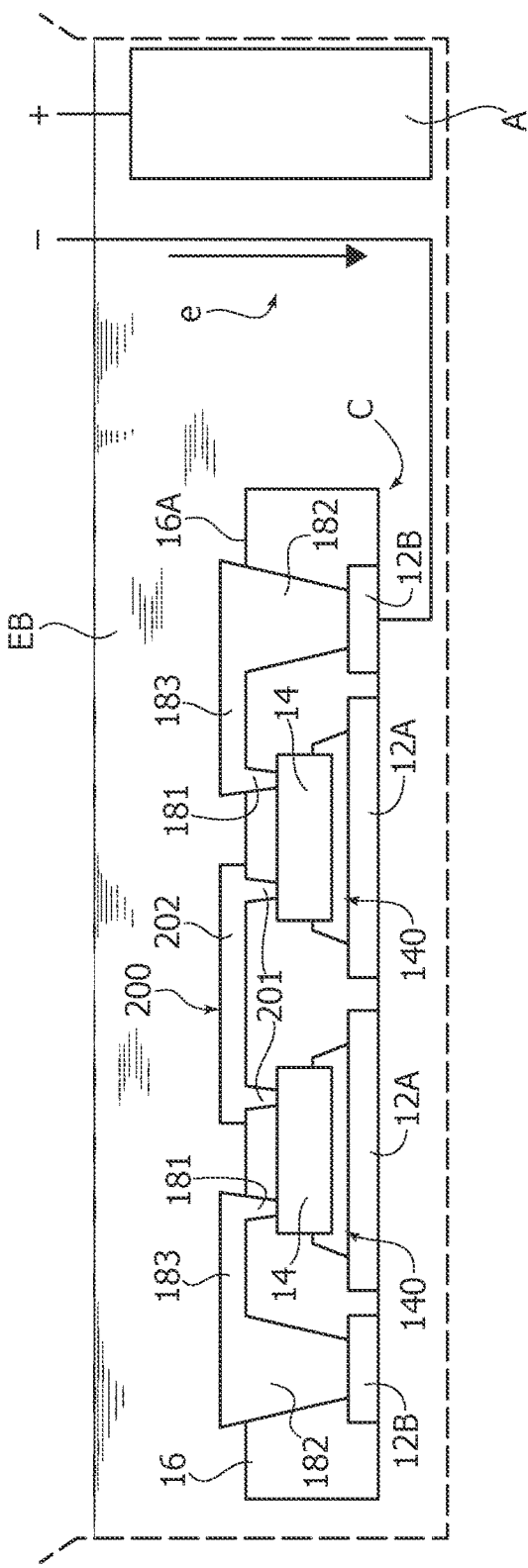
FIG. 1 is exemplary of the possible application of laser direct structuring (LDS) technology to manufacturing semiconductor devices.

FIG. 1 is representative of a possible application of laser direct structuring (LDS) technology in providing die-to-lead coupling in an assembly flow of plural semiconductor devices that are manufactured simultaneously and finally separated into individual devices via a singulation step.

FIG. 1 refers to a (single) device comprising a leadframe having a plurality of die pads 12A (two die pads, for instance) onto which respective semiconductor integrated circuit chips or dice 14 are mounted (for instance attached via die attach material 140) with an array of leads 12B around the die pads 12A and the semiconductor chips or dice 14.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations (leads) that extend inwardly from an outline location in the direction of a semiconductor chip or die thus forming an array of electrically-conductive formations from a die pad configured to have at least one semiconductor chip or die attached thereon. This may be via conventional means such as a die attach adhesive (a die attach film (DAF), for instance).

In FIG. 1 two die pads 12A are illustrated having respective dice or chips 14 attached thereon ("die/dice" and "chip/chips" are used as synonyms throughout this specification).

Figure 2:
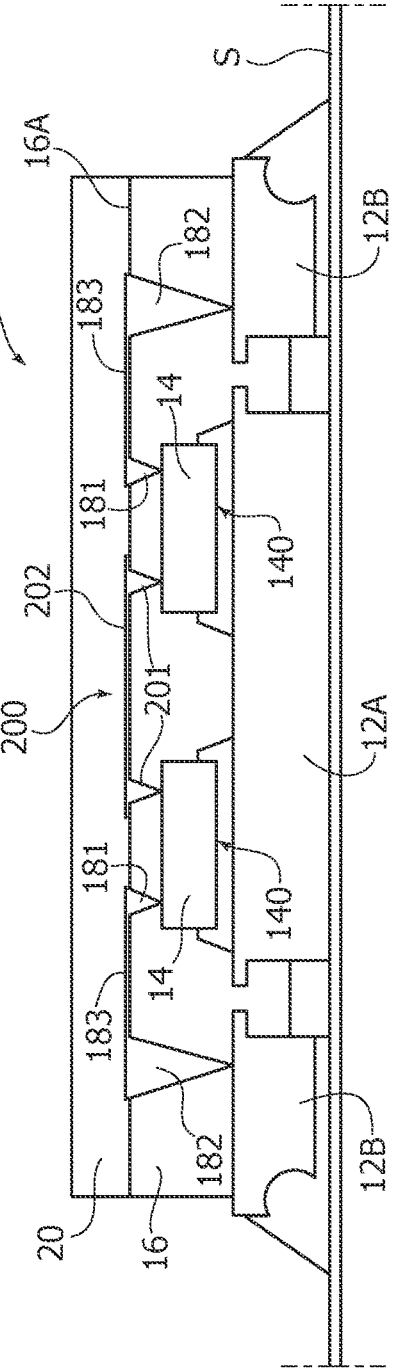
FIG. 2 is a cross-sectional view through a semiconductor device according to embodiments of the present description.

In various embodiments, plural chips 14 can be mounted on a single die pad 12A: for instance, instead of being distinct elements as illustrated in FIG. 1, the two die pads 12A may be joined to form a single die pad having two chips mounted thereon as illustrated in FIG. 2.

Laser Direct Structuring (LDS), oftentimes referred to also as direct copper interconnection (DCI) technology, is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins that include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding that may then be subjected to metallization (for instance via electroless and electroplating with copper or other metals) to finalize a desired conductive pattern.

Documents such as United States Patent Application Publication Nos. 2018/0342453, 2019/0115287, 2020/0203264, 2020/0321274, 2021/0050226, 2021/0050299 or 2021/0183748 (all of which are incorporated herein by reference) are exemplary of the possibility of applying LDS technology in manufacturing semiconductor devices. For instance, LDS technology facilitates replacing wires, clips or ribbons with lines/vias created by laser beam processing of LDS material followed by metallization (growing metal such as copper through plating processes, for instance).

Still referring to FIG. 1, an encapsulation 16 of LDS material can be molded onto the leadframe 12A, 12B having the semiconductor chips or dice 14 mounted thereon.

Electrically-conductive die-to-lead coupling formations can be provided (in a manner known per se: see the published applications cited in the foregoing, for instance) in the LDS material 16.

As illustrated in FIG. 1, these die-to-lead coupling formations comprise: first vias 181, second vias 182 and electrically-conductive lines or tracks (traces) 183.

The first vias 181 extend through the LDS encapsulation 16 between the top (front) surface 16A of the encapsulation (opposed the leadframe 12A, 12B) and electrically-conductive pads (not visible for scale reasons) at the front or top surface of the chips or dice 14.

The second vias 182 extend through the LDS encapsulation 16 between the top (front) surface 16A of the encapsulation and corresponding leads 12B in the leadframe.

The electrically-conductive lines or tracks (traces) 183 extend at the front or top surface 16A of the encapsulation 16 and electrically coupling selected ones of the first vias 181 with selected ones of the second vias 182 to provide a desired die-to-lead electrical connection pattern between the chips or dice 14 and the leads 12B.

Providing the electrically conductive die-to-lead formations 181, 182, and 183 essentially involves structuring these formations in the LDS material 16 (for instance, drilling holes therein at the desired locations for the vias 181, 182) followed by growing electrically-conductive material (a metal such as copper, for instance) at the locations activated (structured) via laser beam energy at the front or top surface 16A of the LDS material 16.

Further details on processing as discussed in the foregoing can be derived from the published applications referred to in the foregoing, for instance.

Extending the use of LDS processing as discussed in the foregoing to producing die-to-die coupling formations is faced with an issue related to the very nature of these formations.

Such die-to-die coupling formations as indicated by 200 in FIG. 1 should desirably comprise: electrically-conductive vias 201 and electrically-conductive lines or tracks 202.

The electrically-conductive vias 201 extend through the LDS encapsulation 16 between the top (front) surface 16A of the encapsulation and die pads (not visible for scale reasons) at the top or front surface of the one and the other of two chips or dice 14 to be mutually connected.

The electrically-conductive lines or tracks 202 extend bridge-like between the first vias 201 at the front or top surface 16A of the encapsulation 16 to complete a desired die-to-die coupling pattern.

Laser beam structuring (also referred to as "activation") of the vias 201 and lines or tracks 202 in the LDS material of the encapsulation 16 can be performed in the same manner of structuring the vias 181, 182 and the lines or tracks 183 used to provide die-to-lead coupling formations as discussed previously.

A critical aspect arises in growing conductive material such as metal (via electroplating, for instance) at the structured locations to provide electrical conductivity as desired—just like in the case of the die-to-lead coupling formations.

Growing such conductive material currently involves (in addition to electroless plating) electroplating, based on the reduction to metal material (e.g., copper) of cations of the metal to be deposited contained in an electrolyte "bath" EB.

Cations such as $Cu^{2+}$ cations are reduced to metallic copper at the cathode C by gaining electrons e from an electric current as schematically represented in FIG. 1 where A denotes the anode of the electrolyte bath containing the cations of the metal to be deposited.

For instance (as otherwise known to those of skill in the art) the electrolyte EB may contain (in the case of deposition of copper) $Cu^{2+}$ cations and $SO_4^{2-}$ anions.

Such a process, that is the $Cu^{2+}$ cations being reduced to metallic copper at the anode in order to produce a conductive path (and, consequently, a desired growth of electrically-conductive metal such as copper at the coupling formations 200) involves gaining electrons e from an electric current flowing via the cathode C represented by the leadframe (e.g., by the leads 12B). Such a current simply cannot flow in an arrangement as illustrated in FIG. 1: there, the formations 200 are electrically isolated from the leadframe (by the chips 14) so that Cu2+ cannot be reduced to metal (copper).

It is noted that, at least in principle, such an issue could be addressed by resorting to LDS technology—only— to provide the die-to-lead electrically conductive formations 181, 182, 183, while other technologies are used to provide the die-to-die coupling as exemplified at 200 in FIG. 1.

Conventional wire bonding may represent a first candidate to consider for die-to-die coupling. An undesirably high resistive path and/or stress applied on device bonding parts representing (negative) factors to take into account.

Providing the die-to-die coupling formations 200 via a conductive paste may be another option to consider. It is noted that filling vias structured in the LDS material 16 with conductive paste may turn out to be unpractical due to paste viscosity.

Creating sacrificial paths within a structure as exemplified in FIG. 1 may be still another option to consider. Again, such an approach is not exempt from drawbacks such as undesired antenna effects and possible resulting design constraints (especially in the case of devices including a high number of input/output connections).

One or more embodiments contemplate replacing (electro)plating processes for growing metal material onto the vias and lines (tracks) structured in the LDS material 16 with a laser-induced forward transfer (LIFT) process.

The LIFT process is a deposition process employing the transfer of material from a donor tape to acceptor substrates via a laser pulse.

The designation LIFT applies to a process (known per se to those of skill in the art) that facilitates transfer of material from a donor tape or sheet (see 300, 302 in FIG. 5) to an acceptor substrate (here, the LDS material) facilitated by laser pulses.

General information on the LIFT process can be found, for instance, in P. Serra, et al.: "Laser-Induced Forward Transfer: Fundamentals and Applications", in Advanced Materials Technologies/Volume 4, Issue 1 (incorporated herein by reference).

Resorting to a LIFT process facilitates having increased design flexibility in a die-to-die coupling and also facilitates using copper as well as silver material for filling the vias and tracks.

FIG. 2 (where parts or element like parts or elements already discussed in connection with FIG. 1 are indicated with like reference symbols, so that a corresponding detailed description will not be repeated) is exemplary of the possibility of providing the die-to-die coupling formations 200 using LIFT technology.

It is noted that in FIG. 2 the two semiconductor chips or dice 14 are shown mounted on a same die pad 12A as an alternative to being mounted on separate distinct die pads as illustrated in FIG. 1.

Also, FIG. 2 illustrates the possibility of molding onto the front or top surface 16A of a "first" encapsulation of LDS material 16 a further protective encapsulation 20 (this can be non-LDS material such as a conventional epoxy resin molding compound) extending over the top portions of the vias 181, 182, and 201 as well as over the lines or tracks 183 and 202.

Figure 3:
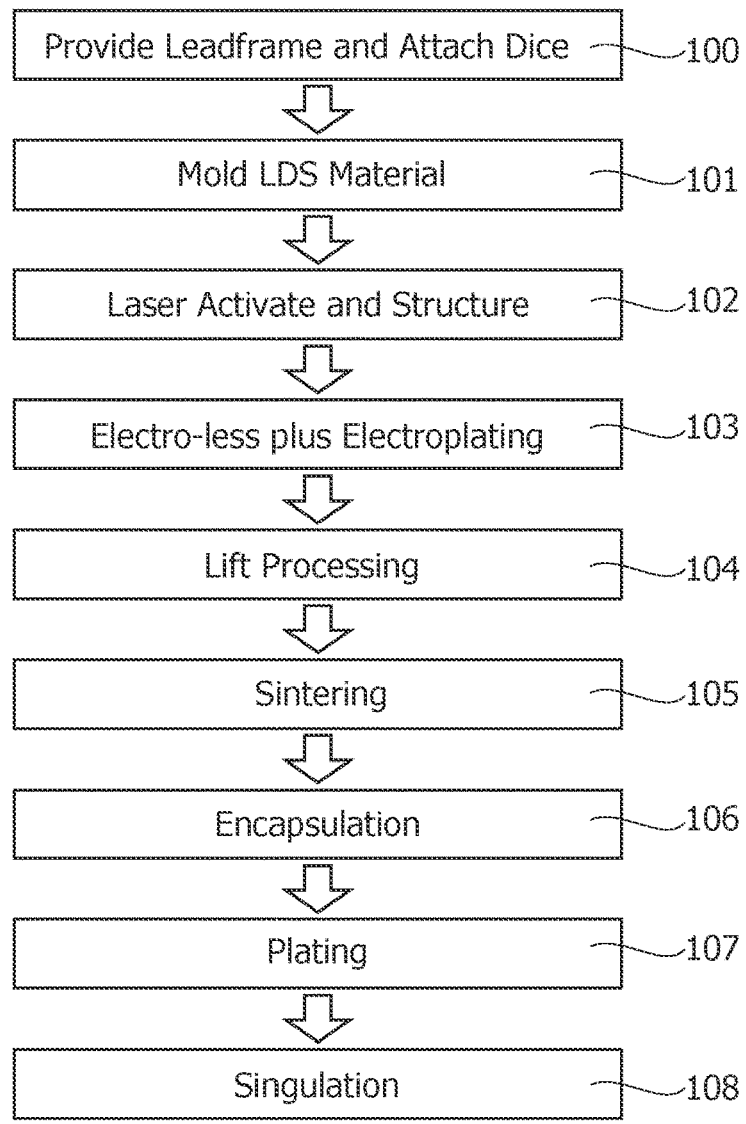
FIG. 3 is a flow chart exemplary of possible steps in embodiments of the present description.

The flowchart of FIG. 3 is exemplary of steps that facilitate providing a semiconductor device having the structure illustrated in the cross-sectional view of FIG. 2.

It is noted that the sequence of steps illustrated in the flowchart of FIG. 3 is merely exemplary and non-mandatory insofar as, for instance: certain steps exemplified in FIG. 3 may be omitted and/or replaced by other steps; additional steps (not illustrated in FIG. 3 for simplicity) may be included in the sequence; and/or certain steps may be implemented concurrently rather than subsequently and/or in an order different from the order represented by way of example in FIG. 3.

Figure 5:
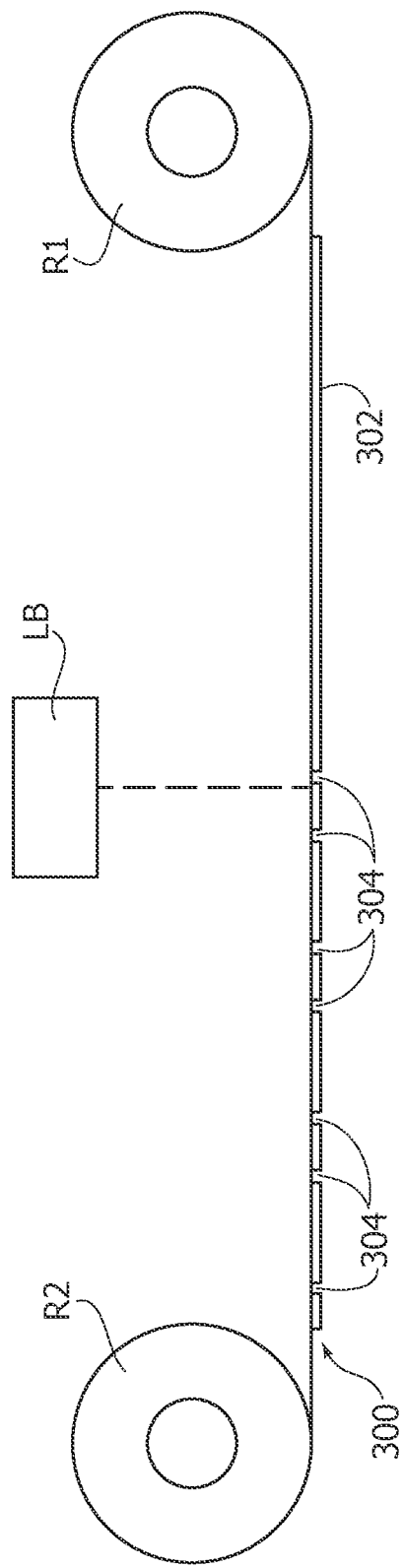
FIG. 5 is a schematic representation of machinery layout for implementing embodiments of the present description.

Also, it will be appreciated that, while possibly included in a same workstation, the LDS processing laser (to "structure" or activate the LDS material 16) and the LIFT processing laser (to transfer metal material to fill the vias 201 and the tracks 202: see LB in FIG. 5) will be generally different laser sources.

The block 100 in the flowchart of FIG. 3 is exemplary of the step of providing a leadframe 12A, 12B and attachment (via die attach material such as 140) of the chips or dice 14 thereon.

The block 101 in the flowchart of FIG. 3 is exemplary of molding and consolidating (e.g., via thermosetting) the LDS encapsulation 16 onto the leadframe 12A, 12B having the chips or dice 14 attached thereon.

In the step of block 102, laser beam activation energy is applied to structure in the LDS material 16 the vias 181, 182 (die-to-lead couplings) and 201 (die-to-die coupling) as well as the lines or tracks 183 (die-to-lead couplings) and 202 (die-to-die coupling or couplings: plural such couplings may in fact be provided).

The block 103 in the flowchart of FIG. 3 is exemplary of electro-less plus electroplating metal material (copper, for instance) to complete the vias 181, 182 and the lines or tracks 183 in the die-to-lead couplings.

It is otherwise noted that: electroless plating will form a (kind of) seed layer (see layer 200A FIG. 4A) also on the die-to-die coupling(s) 200, that is, onto the vias 201 and the lines or tracks 202; and electroplating as performed at the die-to-lead connections (that is, at the vias 181, 182 and the tracks 183) cannot be performed at the vias 201 and the lines or tracks 202 in so far as no electrical ground connection is available at those locations.

The block 104 in the flowchart of FIG. 3 is exemplary of the possibility of growing (filling or printing) further electrically conductive material (metal such as, e.g., copper or silver) also the vias 201 and the lines or tracks 202 via LIFT processing.

In examples as considered herein, electroplating (which cannot be performed at the vias 201 and the lines or tracks 202 due to the lack of the ground connection) is thus "replaced" at the vias 201 and the lines or tracks 202 by LIFT processing for metal deposition.

It was noted that the layer 200A formed by electroless plating (also) at the vias 201 and the lines or tracks 202 in step 103 facilitates adhesion and thus robustness of the subsequent LIFT metallization in step 104.

Figure 4A:
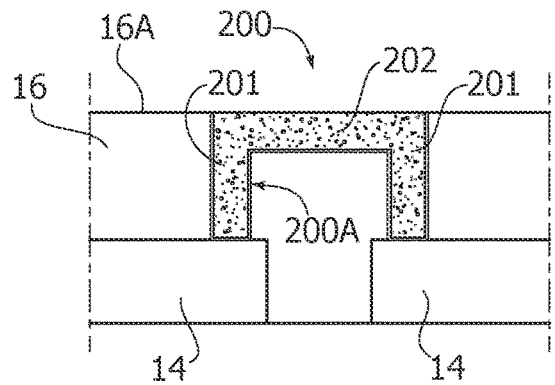
FIGS. 4A and 4B schematically represent results of certain steps in the flowchart of FIG. 3.
Figure 4B:
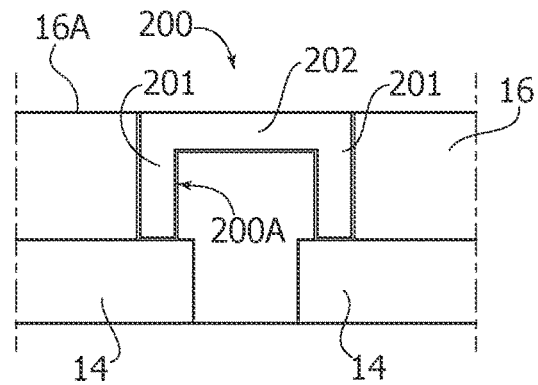

Such a layer is indicated by 200A in both FIGS. 4A and 4B. It will be noted that the provision of this layer 200A is optional, but does provide an advantage in terms of facilitating adhesion.

Specifically, FIG. 4A exemplifies the action of filling the vias 201 and the line(s) 202 (with the "electroless" layer 200A previously formed thereon) via LIFT processing.

The block 105 in the flow-chart of FIG. 3 is representative of in line sintering of the LIFT-printed metal material to complete the vias 201 and the line or track 202 in the die-to-die coupling(s) 200: see FIG. 4B.

The block 106 in the flow-chart of FIG. 3 is representative of the second (e.g., non-LDS) encapsulation 20 being molded onto the front or top surface 16A.

Finally, the blocks 107 and 108 are representative of tin plating of the back or bottom surface (in view of soldering to a substrate S: see FIG. 2) and of singulation to produce individual semiconductor devices 10.

FIGS. 4A and 4B are schematically representative of the process causing the (metal) material such as copper or silver "printed" via the LIFT process to fill the vias 201 and the tracks 202 structured at the front or top surface 16A of the LDS material.

As visible in FIGS. 4A and 4B, the metallization of the die-to-die coupling formations 200 (e.g., 201, 202) comprises a twin layer of electroless metal (see the layer 200A) and LIFT metal.

This bi-layered structure (a first electrically conductive material 200A electroless grown on the LDS material 16 having a second electrically conductive material transferred thereon via LIFT processing) is clearly identifiable even after sintering.

As noted, various examples may benefit from the fact that an electro-less underlayer such as 200A in FIGS. 4A and 4B facilitates adhesion of the LIFT material to the (LDS) molding compound.

A similar bi-layered structure (again a first electrically conductive material electroless grown on the LDS material 16 having a second electrically conductive material electroplated thereon as conventional in LDS processing) is likewise identifiable at the die-to-lead coupling formations 181, 182, 183.

As discussed previously in connection with the block 103 in the flow chart of FIG. 3, electrically conductive material (e.g., copper) can be electroless grown (e.g., in a same step) both at the die-to-die coupling formations 200 (e.g., 201, 202) and at die-to-lead coupling formations 181, 182, 183.

Then (further) electrically conductive material can be: electroplated (as conventional in LDS processing) onto the electrically conductive material electroless grown at the die-to-lead coupling formations 181, 182, 183; and LIFT-transferred onto the electrically conductive material electroless grown at the die-to-die coupling formations 200 (e.g., 201, 202) that are unsuited for conventional electroplating.

Sintering at the die-to-die coupling formations 200 (performed as otherwise known to those of skill in the art) is advantageous in so far as it consolidates the electrically-conductive material drawn (filled) in the vias 201 and lines or tracks 202. One or more embodiments can thus take advantage of the sintered material in providing high-conductivity electrical connections.

As discussed previously (and as otherwise conventional in the art), the LIFT process involves using a donor film (for instance a polyethylene film coated with a thin metal layer).

Such donor film can be provided in the form of donor tape 300 coated with the material that has to be printed (to fill the vias 201 and the lines or tracks 202, in the present case) coated thereon 302 in a roll-to-roll coating process (between two rolls R1, R2). This offers the advantage of facilitating possible handling of plural materials at the same time). The thickness of the coating 302 determines the height of the final layer.

Laser beam energy as exemplified at LB in FIG. 5 then be applied to the coated donor tape 300, 302 (from the uncoated side) at those locations (generically indicated with 304 in FIG. 5) where electrically conductive material such as copper or silver is to be transferred onto the LDS material 16 to fill metal into the vias 201 and over the lines or tracks 202 previously structured therein via laser beam structuring (activation).

Figure 6:
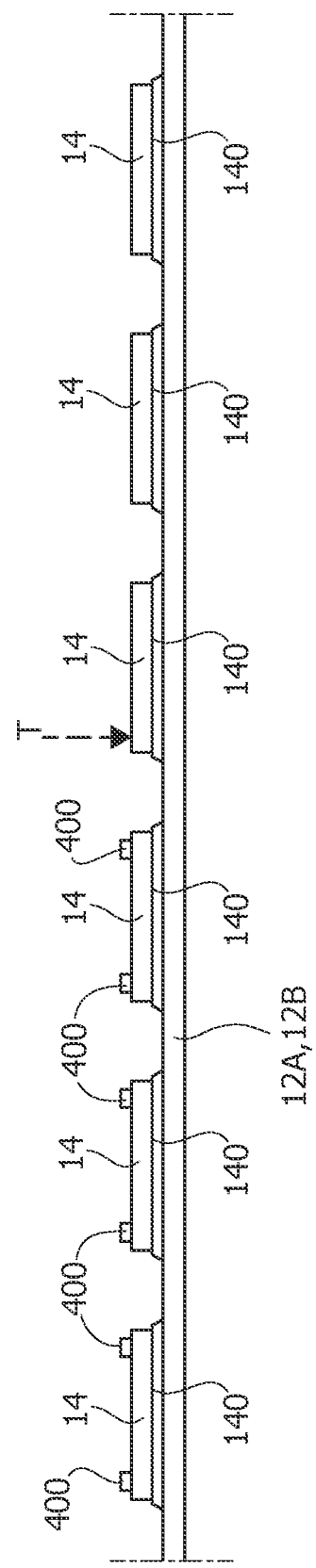
FIG. 6 is further exemplary of possible results in a method according to embodiments of the present description.

FIG. 6 is exemplary of the fact that transfer of the filling material from the donor tape of the LIFT process may also involve forming at the front or top surface of the dice 14 upstanding formations 400 having a thickness leading the distal (upper) end of this material to be visible at the surface of the LDS material 16. Those upstanding formations can be used as references (fiducials) in LDS processing as disclosed in U.S. patent application Ser. No. 17/752,503 filed May 24, 2022 (corresponding to Italian patent application 102021000014198), incorporated herein by reference.

Without prejudice to the underlying principles, the details and the embodiments may vary, even significantly, with respect to what has been described by way of example only without departing from the scope of the embodiments.

The claims are an integral part of the technical teaching provided herein in respect of the embodiments.

The extent of protection is determined by the annexed claims.

The invention claimed is:

1. A method, comprising:
arranging a first semiconductor die and a second semiconductor die on a substrate;
molding an encapsulation of laser direct structuring (LDS) material onto the first semiconductor die and the second semiconductor die arranged on the substrate, the encapsulation of LDS material having a surface opposite the substrate;
providing at least one electrically conductive die-to-die coupling formation between the first semiconductor die and the second semiconductor die, the at least one die-to-die coupling formation comprising: die vias extending through the LDS material between the surface of the encapsulation of LDS material opposite the substrate and the first semiconductor die and the second semiconductor die; and a die-to-die line extending at the surface of the encapsulation of LDS material opposite the substrate and coupling said die vias;
wherein providing said at least one electrically conductive die-to-die coupling formation comprises:
applying laser beam energy to selected locations of the surface of the encapsulation of LDS material opposite the substrate to laser activate and structure said die vias and said die-to-die line in the encapsulation of LDS material; and
applying laser-induced forward transfer (LIFT) processing to transfer electrically conductive material onto said die vias and said die-to-die line extending between the die vias.

2. The method of claim 1, further comprising sintering said electrically conductive material transferred onto said die vias and said die-to-die line extending between the die vias.

3. The method of claim 1, wherein applying LIFT processing to said die vias and said die-to-die line extending between the die vias transfers a metal material made of copper or silver onto said die vias and said die-to-die line extending between the die vias.

4. The method of claim 1, further comprising, after applying laser beam energy and before applying LIFT processing, electroless growing a conductive layer onto said die vias as well as said die-to-die line; wherein said electrically conductive material transferred onto said die vias and said die-to-die line extending between the die vias is applied to the conductive layer.

5. The method of claim 1, wherein arranging comprises arranging the first and second semiconductor dice on at least one die pad in said substrate, the substrate comprising an array of electrically conductive leads around said at least one die pad, and further comprising applying LDS processing to said encapsulation of LDS material to provide die-to-lead electrically conductive formations coupling said first and second semiconductor dice with selected ones of said electrically conductive leads in said array of electrically conductive leads, wherein said die-to-lead electrically conductive formations comprise:
first vias extending through the LDS material between the surface of the encapsulation of LDS material opposite the substrate and the one and the other of the first semiconductor die and the second semiconductor die;
second vias extending through the LDS material between the surface of the encapsulation of LDS material opposite the substrate and selected ones of the electrically conductive leads in said array of electrically conductive leads; and
electrically conductive lines extending at the surface of the encapsulation of LDS material opposite the substrate between selected ones of said first vias and selected ones of said second vias.

6. The method of claim 5, further comprising, after applying laser beam energy and before applying LIFT processing:
electroless growing a layer of electrically conductive material onto said die vias, said die-to-die line, said first vias, said second vias, and said electrically conductive lines; and
then electroplating electrically conductive material onto the layer of electroless grown electrically conductive material at said first vias, said second vias, and said electrically conductive lines;
wherein said electrically conductive material transferred onto said die vias and said die-to-die line extending between the die vias is applied to the layer of electroless grown electrically conductive material.

7. A method, comprising:
molding an encapsulation of laser direct structuring (LDS) material over a first circuit and a second circuit, the encapsulation of LDS material having an upper surface;
applying laser beam energy to selected locations of the upper surface of the encapsulation of LDS material to laser activate and structure first and second vias extending through the LDS material between the upper surface and the first and second circuits, respectively;
applying laser beam energy to selected locations of the upper surface of the encapsulation of LDS material to laser activate and structure a connection line in the encapsulation of LDS material extending at the upper surface between the first and second vias;
electroless growing a conductive layer onto said first and second vias as well as said connection line; and
applying laser-induced forward transfer (LIFT) processing to transfer electrically conductive material onto said conductive layer at the first and second vias and the connection line.

8. The method of claim 7, further comprising sintering said electrically conductive material transferred onto said conductive layer at the first and second vias and the connection line.

9. The method of claim 7, wherein applying LIFT processing transfers a metal material made of copper or silver onto said conductive layer at the first and second vias and the connection line.

10. The method of claim 7, wherein said first and second circuits are supported by a substrate including an array of electrically conductive leads, the method further comprising:
applying laser beam energy to selected locations of the upper surface of the encapsulation of LDS material to laser activate and structure third and fourth vias extending through the LDS material between the upper surface and the array of electrically conductive leads;
applying laser beam energy to selected locations of the upper surface of the encapsulation of LDS material to laser activate and structure a further connection line in the encapsulation of LDS material extending at the upper surface between the third and fourth vias;
electroless growing a further conductive layer onto said third and fourth vias as well as said further connection line; and
applying LIFT processing to transfer electrically conductive material onto said further conductive layer at the third and fourth vias and the further connection line.

11. The method of claim 10, further comprising electroplating electrically conductive material onto the further conductive layer.

* * * * *